United States Patent
Woo et al.

(12)

(10) Patent No.: US 6,687,456 B1
(45) Date of Patent: Feb. 3, 2004

(54) IN-LINE FLUID HEATER

(75) Inventors: Tien-Hsing Woo, Taipei (TW); Ruei-Hung Jang, Shinjuang (TW); Chih-Lin Ying, Hsin Chu (TW); Ming-Kuo Yu, Hsinchu (TW); Shih-Shiung Chen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/196,595

(22) Filed: Jul. 15, 2002

(51) Int. Cl.$^7$ ................................................. F21V 7/00
(52) U.S. Cl. ...................................... 392/424; 392/376
(58) Field of Search ................................. 392/420, 422, 392/424, 483, 405, 407, 418, 376; 219/405

(56) References Cited

U.S. PATENT DOCUMENTS

| | | | | |
|---|---|---|---|---|
| 4,569,329 A | * | 2/1986 | Cherryholmes | ............ 126/92 B |
| 5,790,752 A | * | 8/1998 | Anglin et al. | ................ 392/483 |
| 6,108,491 A | * | 8/2000 | Anderson | .................... 392/418 |
| 6,122,440 A | * | 9/2000 | Campbell | .................... 392/420 |
| 6,304,719 B1 | * | 10/2001 | Mo | .............................. 392/376 |
| 6,310,327 B1 | * | 10/2001 | Moore et al. | ................ 219/405 |
| 6,370,327 B1 | * | 4/2002 | Seguy et al. | ................. 392/407 |
| 6,393,211 B1 | * | 5/2002 | Jolan et al. | ................... 392/423 |
| 6,443,616 B1 | * | 9/2002 | Brotz | ........................... 374/17 |
| 6,544,022 B2 | * | 4/2003 | Lanser et al. | ................... 425/3 |
| 2002/0118961 A1 | * | 8/2002 | Choi | ........................... 392/422 |
| 2003/0026603 A1 | * | 2/2003 | Castaneda et al. | ........... 392/483 |
| 2003/0135250 A1 | * | 7/2003 | Lauman et al. | .............. 607/104 |

* cited by examiner

Primary Examiner—Sang Y. Paik
Assistant Examiner—Leonid Fastovsky
(74) Attorney, Agent, or Firm—Tung & Associates

(57) ABSTRACT

An in-line fluid heater including a heater housing that contains a parabolic lamp vessel which houses an infrared lamp. A parabolic reflection vessel in the heater housing is separated from the parabolic lamp vessel by a convex lens. A quartz plate seals the heater housing, and at least one, and typically, multiple leak detectors may be provided in the heater housing. The interior reflective surface of the reflection vessel reflects the heat energy in parallel rays through the quartz plate and to the fluid to be heated. The leak detectors may be connected to an RC circuit which operates a controller to actuate a buzzer or alarm and terminate operation of the heater upon leakage of fluid into the heater housing.

20 Claims, 1 Drawing Sheet

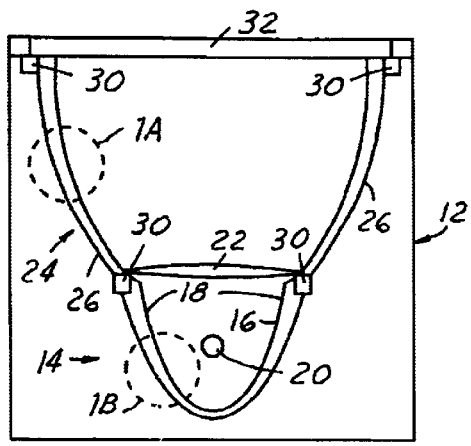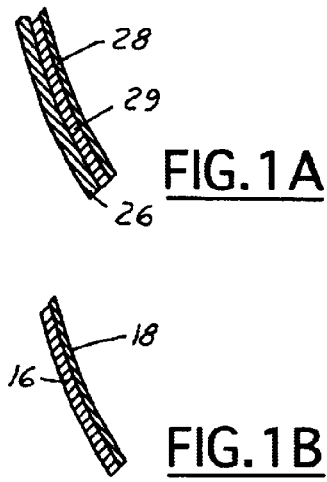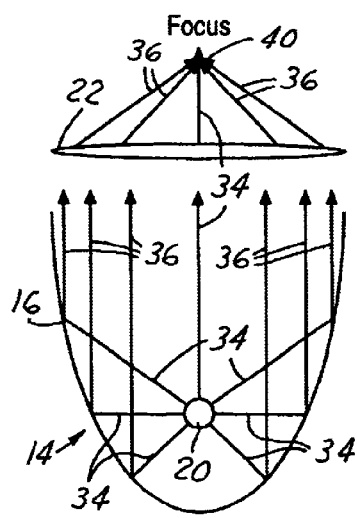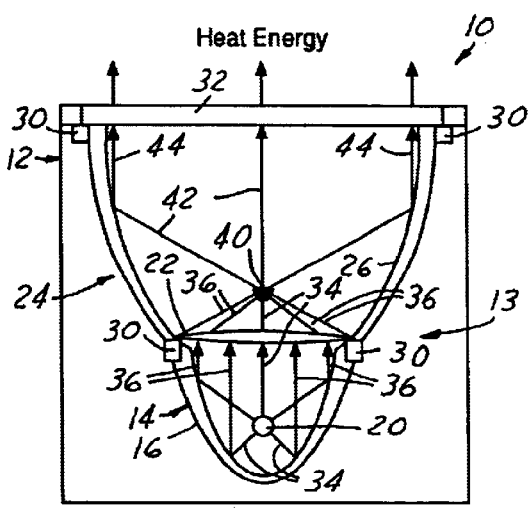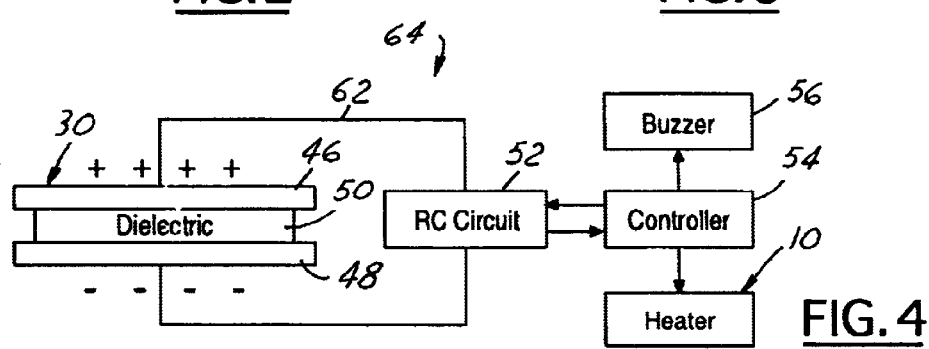

IN-LINE FLUID HEATER

FIELD OF THE INVENTION

The present invention relates to heaters for heating process fluids used in the fabrication of integrated circuits on semiconductors. More particularly, the present invention relates to an in-line fluid heater including a parabolic lamp vessel and a parabolic reflection vessel for generating parallel heat energy rays to heat processing fluids.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Many of the various processing steps, including etching and chemical vapor deposition (CVD), used in the semiconductor fabrication process require heated process fluids or chemicals for the formation of integrated circuits on the wafer substrate. In general applications, various types of heaters which are designed to prevent particle contamination of the process chemicals or fluids during heating are widely used in hydraulic systems. These heaters heat the fluids typically either by conduction from a coated heating element immersed in the fluids, or by radiation of heat energy from a heat source through an inert transparent tube to the fluids.

A common drawback of the conductor-type heaters is that the coating material on the heating element frequently becomes damaged, and this results in particle contamination of the fluids to be heated. Furthermore, the heater typically lacks both a warning system to notify personnel of the damaged coating on the element and a protective mechanism which would otherwise prevent further contamination of the fluids. Although radiation-type heaters are frequently equipped with differential pressure detectors or moisture sensors which monitor and alert personnel to the leakage of fluids through cracks that form in the quartz tube, the heaters are not equipped with any protective mechanism and thus, particles from the cracked tube still contaminate the fluid. Consequently, particle contamination of the chemical baths caused by the damaged heaters of each type reduces the wafer throughput and the yield of circuits on the wafer. Moreover, both the conductive-type and radiation-type heaters tend to be inefficient, and radiation-type heaters are attended by a potential fire risk.

Accordingly, an object of the present invention is to provide a new and improved heater for heating fluids in a variety of applications.

Another object of the present invention is to provide a new and improved heater for heating process fluids or chemicals used in the fabrication of semiconductor integrated circuits.

Still another object of the present invention is to provide a fluid heater which overcomes several of the drawbacks of conventional fluid heaters.

Yet another object of the present invention is to provide a fluid heater which may be equipped with a leak detector or detectors.

A still further object of the present invention is to provide a fluid heater which is efficient and utilizes a parabolic reflector to transmit parallel heat energy rays to a fluid to be heated.

Still another object of the present invention is to provide a radiation-type heater which may be equipped with at least one leak detector that is capable of notifying personnel of the presence of a fluid leakage in the heater.

Another object of the present invention is to provide a radiation-type heater which may be equipped with a leak detector or detectors operably connected to a heater controller and buzzer or alarm to facilitate shutdown of the heater and notification of personnel in the event of the leakage of fluid into the heater.

Yet another object of the present invention is to provide a radiation-type heater which is safe to operate and wherein potential fire risk is substantially reduced.

SUMMARY OF THE INVENTION

In accordance with these and other objects and advantages, the present invention comprises an in-line fluid heater including a heater housing that contains a parabolic lamp vessel which houses an infrared lamp. A parabolic reflection vessel in the heater housing is separated from the parabolic lamp vessel by a convex lens. A quartz plate seals the heater housing, and at least one, and typically, multiple leak detectors may be provided in the heater housing. The interior reflective surface of the reflection vessel reflects the heat energy in parallel rays through the quartz plate and to the fluid to be heated. The leak detectors may be connected to an RC circuit which operates a controller to actuate a buzzer or alarm and terminate operation of the heater upon leakage of fluid into the heater housing.

BRIEF DESCRIPTION OF THE DRAWINGS

The invention will now be described, by way of example, with reference to the accompanying drawings, in which:

FIG. 1 illustrates an illustrative embodiment of an in-line fluid heater of the present invention;

FIG. 1A is a sectional view taken along section line 1A in FIG. 1;

FIG. 1B is a sectional view taken along section line 1B in FIG. 1;

FIG. 2 illustrates a typical reflection pattern of infrared rays reflected from the parabolic lamp vessel to the parabolic reflection vessel of the present invention in typical application of the present invention;

FIG. 3 illustrates a typical reflection pattern of infrared rays reflected from the parabolic lamp vessel and parallel reflection of infrared rays from the parabolic reflection vessel of the present invention; and FIG. 4 is a schematic view illustrating a typical leak detection and heater control and alarm system in application of the present invention.

DESCRIPTION OF THE PREFERRED EMBODIMENTS

The present invention has particularly beneficial utility in the heating of process fluids used to fabricate integrated circuits on semiconductor wafers in the semiconductor production industry. However, the invention is not so limited in application, and while references may be made to such process fluids, the invention is more generally applicable to heating fluids in a variety of mechanical and industrial applications.

Referring initially to FIGS. 1–1B, the in-line fluid heater of the present invention is generally indicated by reference numeral 10 and includes a heater housing 12 which is typically constructed of an inert material such as Teflon (trademark), or polytetrafluoroethylene, and defines a housing interior 13. A first order parabolic vessel, or parabolic lamp vessel 14, is provided in the lower portion of the housing interior 13. The parabolic lamp vessel 14 includes a parabolic-shaped vessel wall 16, the interior surface of which is coated with a reflective layer 18, such as aluminum, as illustrated in FIG. 1B. An infrared lamp 20 is centrally provided in the interior of the parabolic lamp vessel 14.

A second order parabolic vessel, or parabolic reflection vessel 24, is contained in the upper portion of the housing interior 13, above the parabolic lamp vessel 14, and is defined by a parabolic-shaped vessel wall 26. As illustrated in FIG. 1A, the interior surface of the vessel wall 26 is coated by a reflective layer 29, such as aluminum, for example. A transparent glass layer 28, such as quartz, coats the reflective layer 29. The interior of the reflection vessel 24 is separated from the exterior of the heater housing 12 by a typically quartz plate 32 which is seated in the heater housing 12 at the mouth of the reflection vessel 24. A first pair of leak detectors 30 is provided in the housing interior 13, typically at the upper portion of the vessel wall 26, and a second pair of leak detectors 30 is typically further provided in the housing interior 13, between the lamp vessel 14 and the reflector vessel 24, for example. A convex lens 22 provided at the mouth of the lamp vessel 14 separates the interior of the lamp vessel 14 from the interior of the reflection vessel 24.

Referring next to FIG. 4, each of the leak detectors 30 is typically part of a control and alarm system 64 for the heater 10. Each leak detector 30 may function as a capacitor and typically includes a positive electrode 46 separated from a negative electrode 48 by a dielectric 50. Preferably, the positive electrode 46 and the negative electrode 48 are each coated with an inert or non-reactive material which resists acid corrosion of the electrodes. Wiring 60 connects the positive electrode 46 to an RC circuit 52, and additional wiring 62 connects the negative electrode 48 to the RC circuit 52. The RC circuit 52 is further connected to a heater controller 54, which is, in turn, operably connected to both an alarm such as a buzzer 56 and to the infrared lamp 20 in the heater 10 of the present invention.

Referring next to FIGS. 2 and 3, in application the in-line fluid heater 10 of the present invention is used to heat a processing fluid (not shown) which is contained in a vessel (not shown) and disposed in contact with the quartz plate 32. Such processing fluids include chemicals used in etching or chemical vapor deposition processes, for example, implemented in the fabrication of integrated circuits on semiconductor wafers. However, it will be appreciated by those skilled in the art that the heater 10 may be used in a variety of other applications. Accordingly, the infrared lamp 20 is operated to generate infrared rays 34 which radiate outwardly in all directions from the infrared lamp 20. The infrared rays 34 initially strike and are reflected from the interior reflective surface 18 of the parabolic lamp vessel 14, which reflects the infrared rays 34 as reflected infrared rays 36. Due to the parabolic configuration of the vessel wall 16, the reflected infrared rays 36 are reflected from the reflective surface 18 in parallel relationship to each other, as illustrated. The parallel infrared rays 34 radiating directly from the infrared lamp 20 and the parallel reflected heat rays 36 reflected from the reflective surface 18 strike the convex lens 22, which focuses or converges both the infrared rays 34 and the reflected infrared rays 36 onto a focal point 40 in the interior of the parabolic reflective vessel 24. The focal point 40 serves as a passive heating source in the reflective vessel 24. Focal infrared rays 42 radiate outwardly in all directions from the focal point 40 and strike the interior reflective layer 29 (FIG. 1A) on the vessel wall 26 of the parabolic reflective vessel 24. The focal infrared rays 42 are reflected from the reflective surface 29 as parallel reflected focal rays 44, which radiate through the quartz plate 32 and heat the processing fluid that is contained in the fluid vessel and in contact with the quartz plate 32.

Referring again to FIG. 4, in the event that processing fluid inadvertently enters the housing interior 13 such as through a crack (not shown) in the quartz plate 32, for example, the fluid contacts at least one of the leak detectors 30 and establishes electrical contact between the positive electrode 46 and the negative electrode 48 of the leak detector 30. The RC circuit 52 senses the decreased capacitance between the positive electrode 46 and the negative electrode 48. The appropriate data is transmitted from the RC circuit 52 to the controller 54, which typically trips the alarm such as the buzzer 56 to alert personnel to the presence of the leak in the heater 10. Simultaneously, the controller 54 terminates operation of the lamp 20 in the heater 10 in order to terminate further heating of the processing fluids and particle contamination of the processing fluids, as well as to enable repair of the heater 10.

It will be appreciated by those skilled in the art that the glass coating 28 on the reflective surface 29 of the reflection vessel 24 prevents metal particle contamination of processing fluids in the event that the fluids leak through a crack in the quartz plate 32 and contact the glass layer 28. This, in turn, prevents metal particle contamination of wafer substrates during the fabrication of circuits on the wafer using the process fluids. The parabolic shape of the lamp vessel 14 and the reflection vessel 24 transmits the infrared heat radiation into parallel rays, and this applies the heat energy to the process fluids in an efficient manner. Consequently, overheating of the infrared lamp 20 is prevented and the lifetime of the lamp 20 is extended.

While the preferred embodiments of the invention have been described above, it will be recognized and understood that various modifications may be made in the invention and the appended claims are intended to cover all such modifications which may fall within the spirit and scope of the invention.

Having described our invention with the particularity set forth above, we claim.

What is claimed is:

1. A heater comprising:
   a lamp vessel comprising a generally parabolic-shaped lamp vessel wall;
   a first reflective layer provided on said lamp vessel wall;
   an infrared lamp provided in said lamp vessel;
   a reflection vessel disposed in radiation-receiving communication with said lamp vessel, said reflection vessel comprising a generally parabolic-shaped reflection vessel wall;
   a second reflective layer provided on said reflection vessel wall;
   a lens provided between said lamp vessel and said reflection vessel; and
   a transparent plate closing said reflection vessel.

2. The heater of claim 1 further comprising a glass layer coating said second reflective layer.

3. The heater of claim 1 further comprising at least one leak detector proximate said reflection vessel.

4. The heater of claim 3 further comprising a glass layer coating said second reflective layer.

5. The heater of claim 1 further comprising at least one leak detector proximate said lamp vessel.

6. The heater of claim 5 further comprising a glass layer coating said second reflective layer.

7. The heater of claim 5 further comprising at least one leak detector proximate said reflection vessel.

8. The heater of claim 7 further comprising a glass layer coating said second reflective layer.

9. A heater comprising:
   a heater housing;
   a lamp vessel provided in said heater housing, said lamp vessel comprising a generally parabolic-shaped lamp vessel wall;
   a first reflective layer provided on said lamp vessel wall;
   an infrared lamp provided in said lamp vessel;
   a reflection vessel disposed in radiation-receiving communication with said lamp vessel in said heater housing, said reflection vessel comprising a generally parabolic-shaped reflection vessel wall;
   a second reflective layer provided on said reflection vessel wall;
   a lens provided between said lamp vessel and said reflection vessel; and
   a transparent plate closing said reflection vessel.

10. The heater of claim 9 further comprising a glass layer coating said second reflective layer.

11. The heater of claim 9 further comprising at least one leak detector provided in said heater housing proximate said reflection vessel.

12. The heater of claim 11 further comprising a glass layer coating said second reflective layer.

13. The heater of claim 9 further comprising at least one leak detector provided in said heater housing proximate said lamp vessel.

14. The heater of claim 13 further comprising a glass layer coating said second reflective layer.

15. The heater of claim 13 further comprising at least one leak detector provided in said heater housing proximate said reflection vessel.

16. The heater of claim 15 further comprising a glass layer coating said second reflective layer.

17. A heater comprising:
   a lamp vessel comprising a generally parabolic-shaped lamp vessel wall;
   a first reflective layer provided on said lamp vessel wall;
   an infrared lamp provided in said lamp vessel;
   a reflection vessel disposed in radiation-receiving communication with said lamp vessel, said reflection vessel comprising a generally parabolic-shaped reflection vessel wall;
   a second reflective layer provided on said reflection vessel wall;
   a lens provided between said lamp vessel and said reflection vessel;
   a transparent plate closing said reflection vessel;
   at least one leak detector disposed in proximity to said reflection vessel; and
   a controller operably connected to said at least one leak detector and said infrared lamp.

18. The heater of claim 17 wherein said at least one leak detector further comprises at least one leak detector disposed in proximity to said lamp vessel.

19. The heater of claim 17 wherein said at least one leak detector comprises a positive electrode, a negative electrode spaced from said positive electrode and a dielectric between said positive electrode and said negative electrode.

20. The heater of claim 17 further comprising an alarm and wherein said controller is operably connected to said alarm.

* * * * *